United States Patent
Nam

(10) Patent No.: US 10,630,233 B2
(45) Date of Patent: Apr. 21, 2020

(54) SOLAR CELL MODULE

(71) Applicant: LG ELECTRONICS INC., Seoul (KR)

(72) Inventor: Hyukjin Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/729,784

(22) Filed: Oct. 11, 2017

(65) Prior Publication Data

US 2018/0102735 A1 Apr. 12, 2018

(30) Foreign Application Priority Data

Oct. 11, 2016 (KR) .................. 10-2016-0131504

(51) Int. Cl.
| | |
|---|---|
| H02S 40/32 | (2014.01) |
| H01L 31/0224 | (2006.01) |
| H02S 40/34 | (2014.01) |
| H01L 31/02 | (2006.01) |
| H01L 31/05 | (2014.01) |

(52) U.S. Cl.
CPC ........ *H02S 40/32* (2014.12); *H01L 31/02008* (2013.01); *H01L 31/022425* (2013.01); *H01L 31/05* (2013.01); *H02S 40/34* (2014.12)

(58) Field of Classification Search
CPC ... H02S 40/32; H02S 40/34; H01L 31/02008; H01L 31/022425; H01L 31/05
USPC .......................................... 136/244
See application file for complete search history.

(56) References Cited

U.S. PATENT DOCUMENTS

| | | | | |
|---|---|---|---|---|
| 2011/0083733 | A1* | 4/2011 | Marroquin | H05K 7/10 136/256 |
| 2013/0092216 | A1* | 4/2013 | Yan | H02S 50/10 136/251 |
| 2014/0034126 | A1* | 2/2014 | Yang | H01L 31/18 136/258 |
| 2015/0122305 | A1 | 5/2015 | Marroquin et al. | |
| 2015/0200603 | A1* | 7/2015 | Nam | H02M 5/4585 363/37 |
| 2015/0288327 | A1* | 10/2015 | Cherukupalli | H02S 30/10 136/251 |
| 2016/0118933 | A1* | 4/2016 | Russell | H02S 40/32 136/251 |

FOREIGN PATENT DOCUMENTS

| | | |
|---|---|---|
| EP | 2 897 286 A2 | 7/2015 |
| EP | 2 899 880 A1 | 7/2015 |

(Continued)

OTHER PUBLICATIONS

European Search Report dated Mar. 1, 2018, in EP Patent Application No. 17195877.0 (6 pages).

*Primary Examiner* — Jayne L Mershon
(74) *Attorney, Agent, or Firm* — Finnegan, Henderson, Farabow, Garrett & Dunner, L.L.P.

(57) ABSTRACT

Disclosed is a solar cell module in which a terminal and a circuit unit are spaced apart from each other so as not to overlap each other and the circuit unit is spaced apart from a solar cell panel. The solar cell module includes a solar cell panel, a circuit unit, an inverter-fixing member disposed on the rear surface of the solar cell panel, and a ribbon that connects a terminal protruding from the rear surface of the solar cell panel to the circuit unit.

19 Claims, 12 Drawing Sheets

(56) References Cited

FOREIGN PATENT DOCUMENTS

| EP | 2 937 992 A2 | 10/2015 |
|---|---|---|
| JP | 2011-049218 A | 3/2011 |
| KR | 10-2010-00114847 | 10/2010 |
| KR | 10-2015-0133594 | 11/2015 |
| KR | 10-2016-0001050 | 1/2016 |
| WO | WO 2012/163983 A2 | 12/2012 |

* cited by examiner

【Fig 1 (a)】
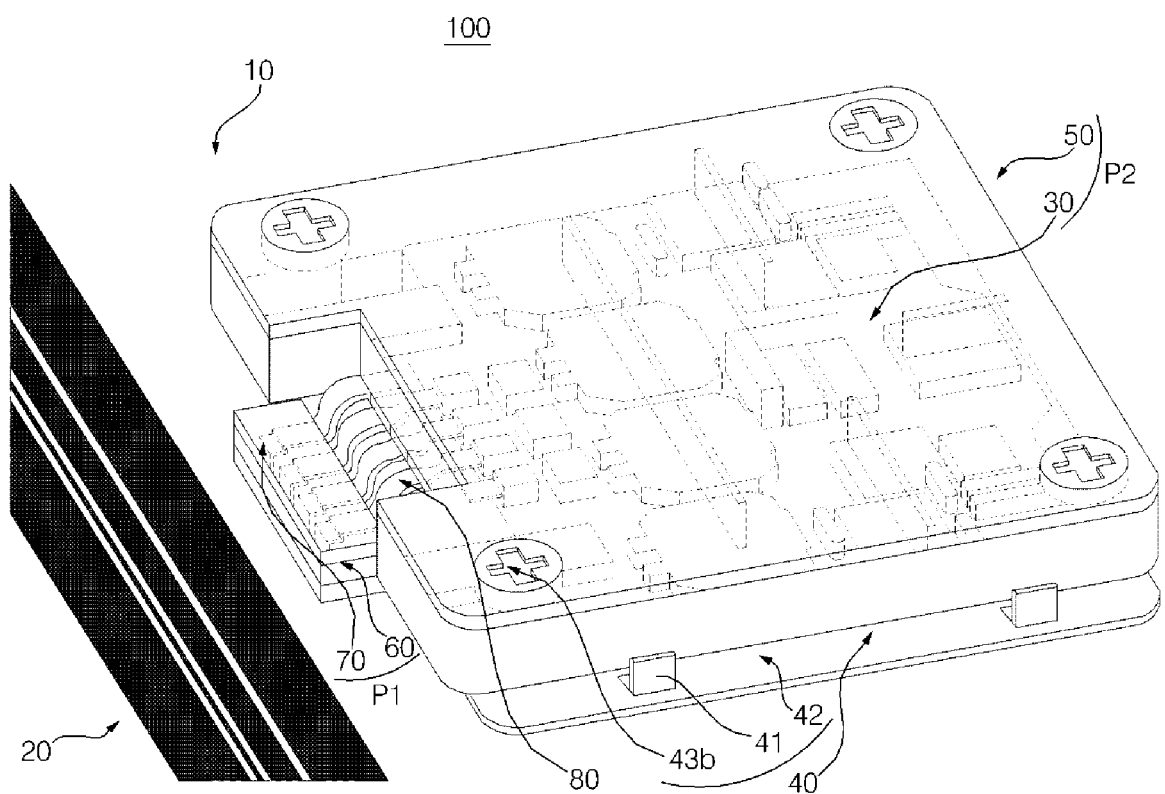

[Fig 1 (b)]
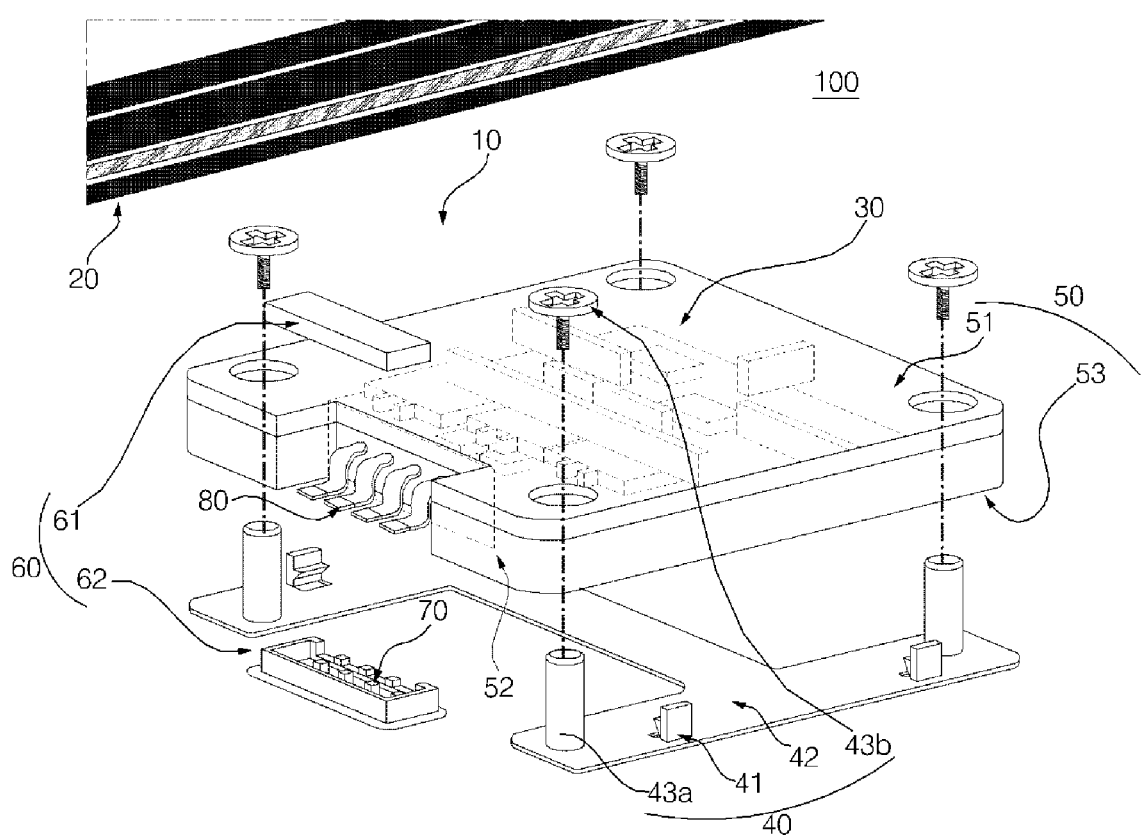

[ Fig 2 ]
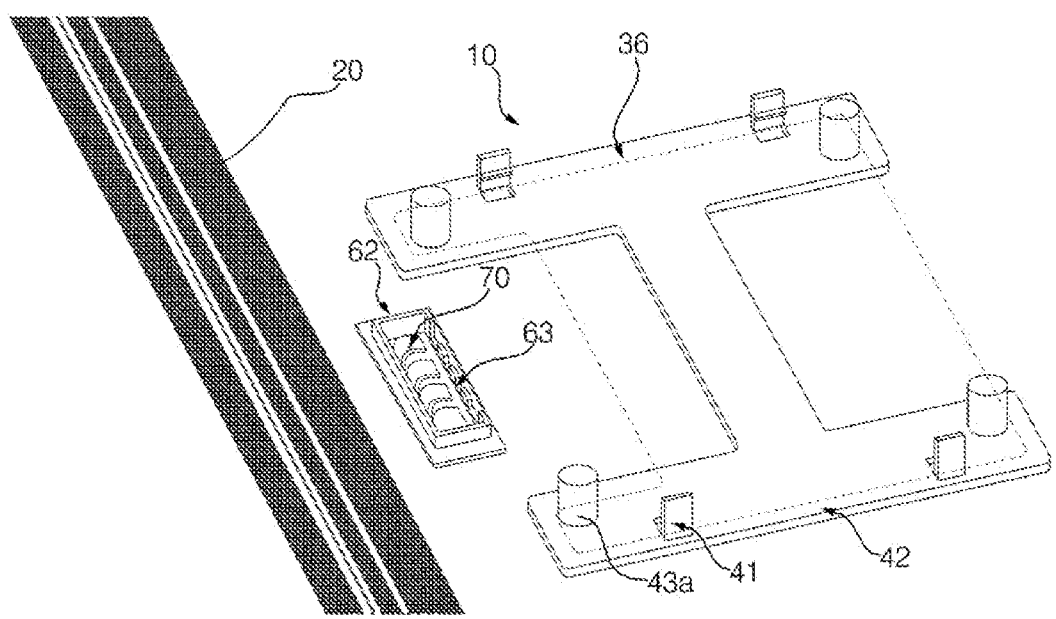

[Fig 3]
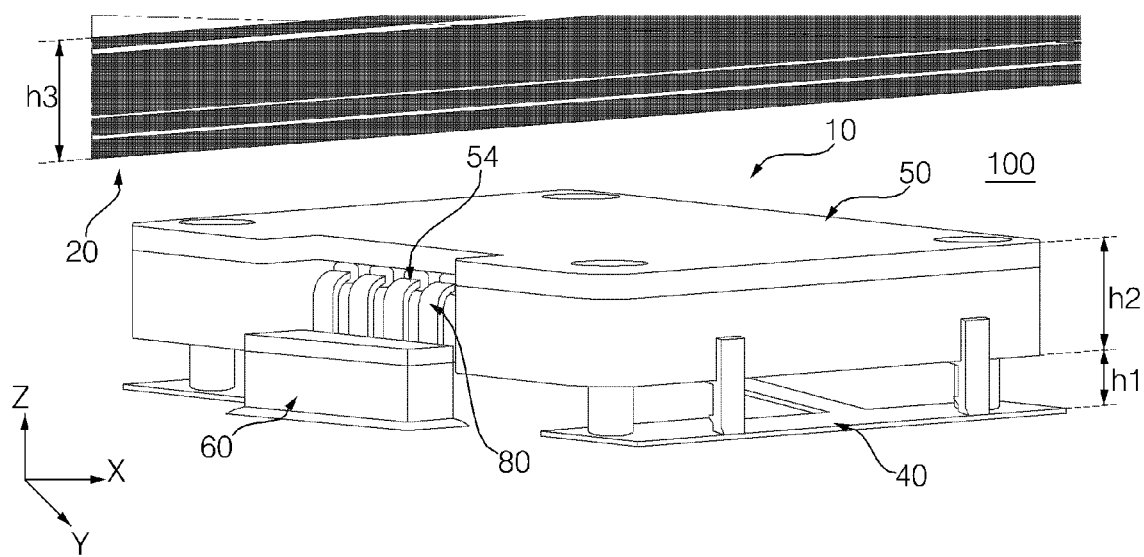

【 Fig 4 (a) 】
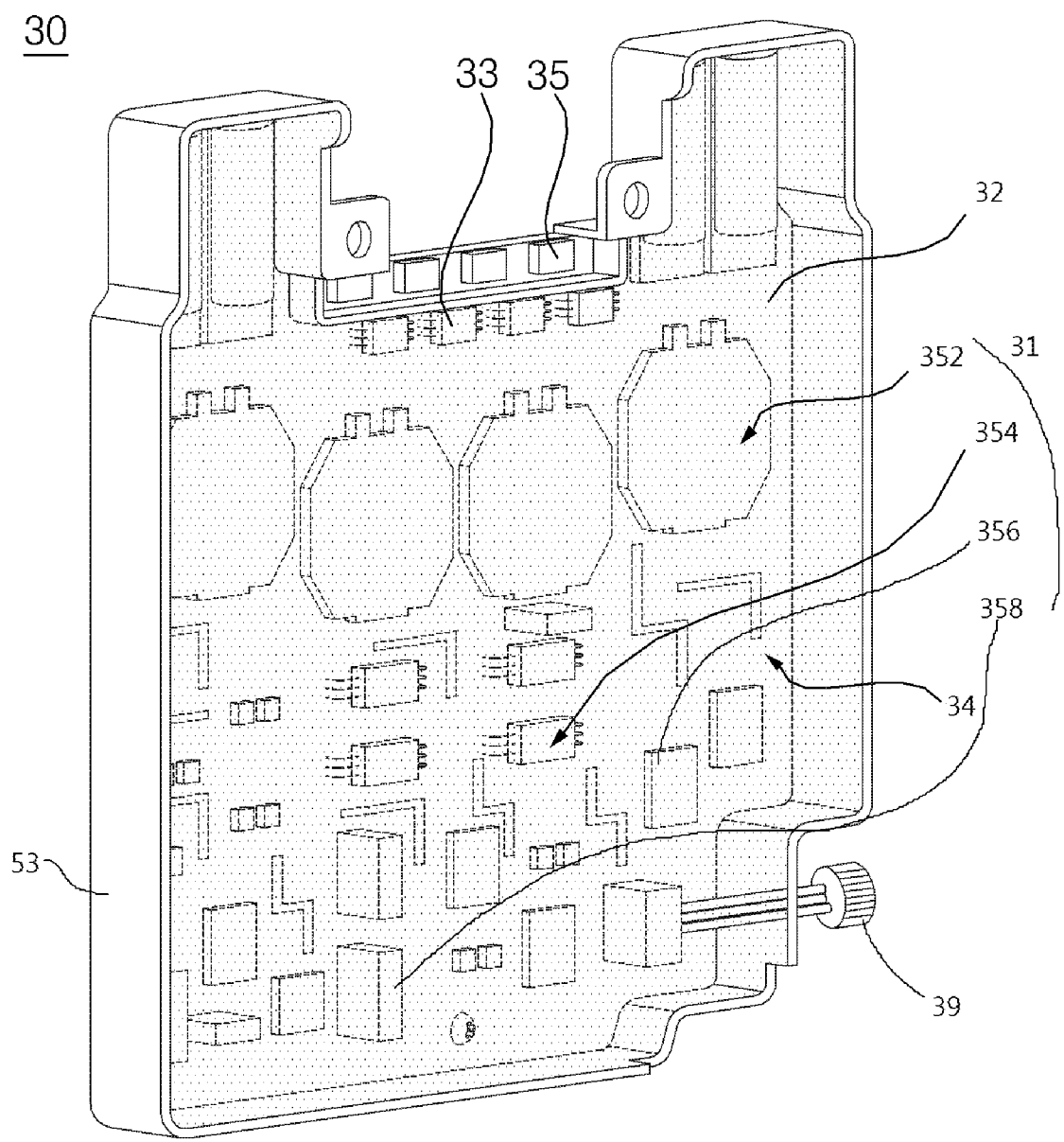

【Fig 4 (b)】
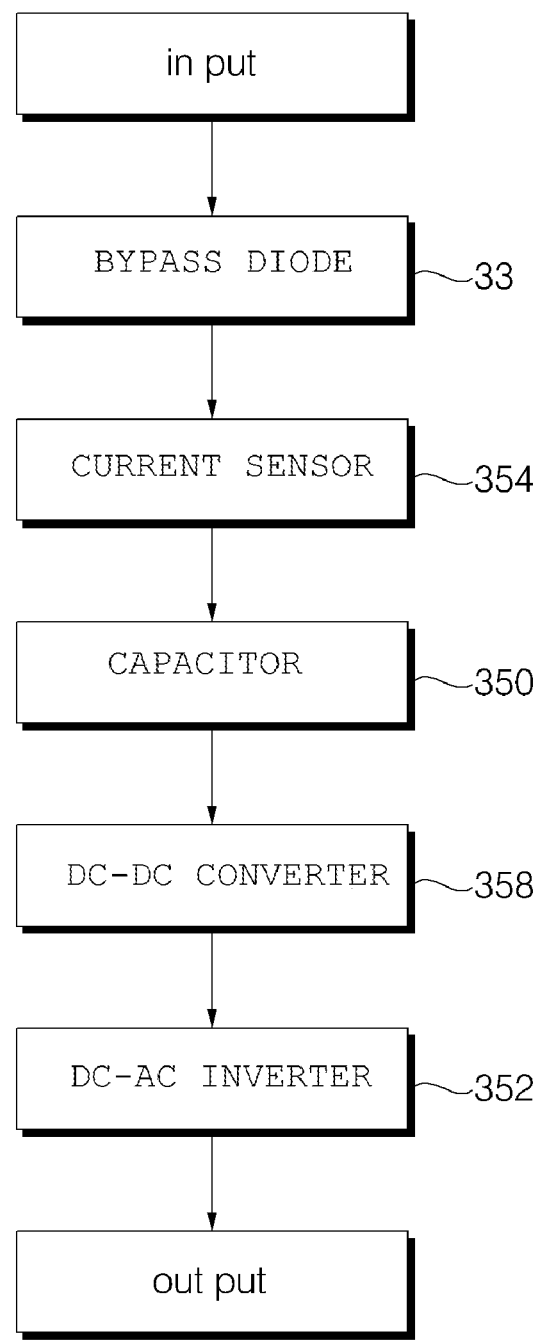

【 Fig 5 (a) 】
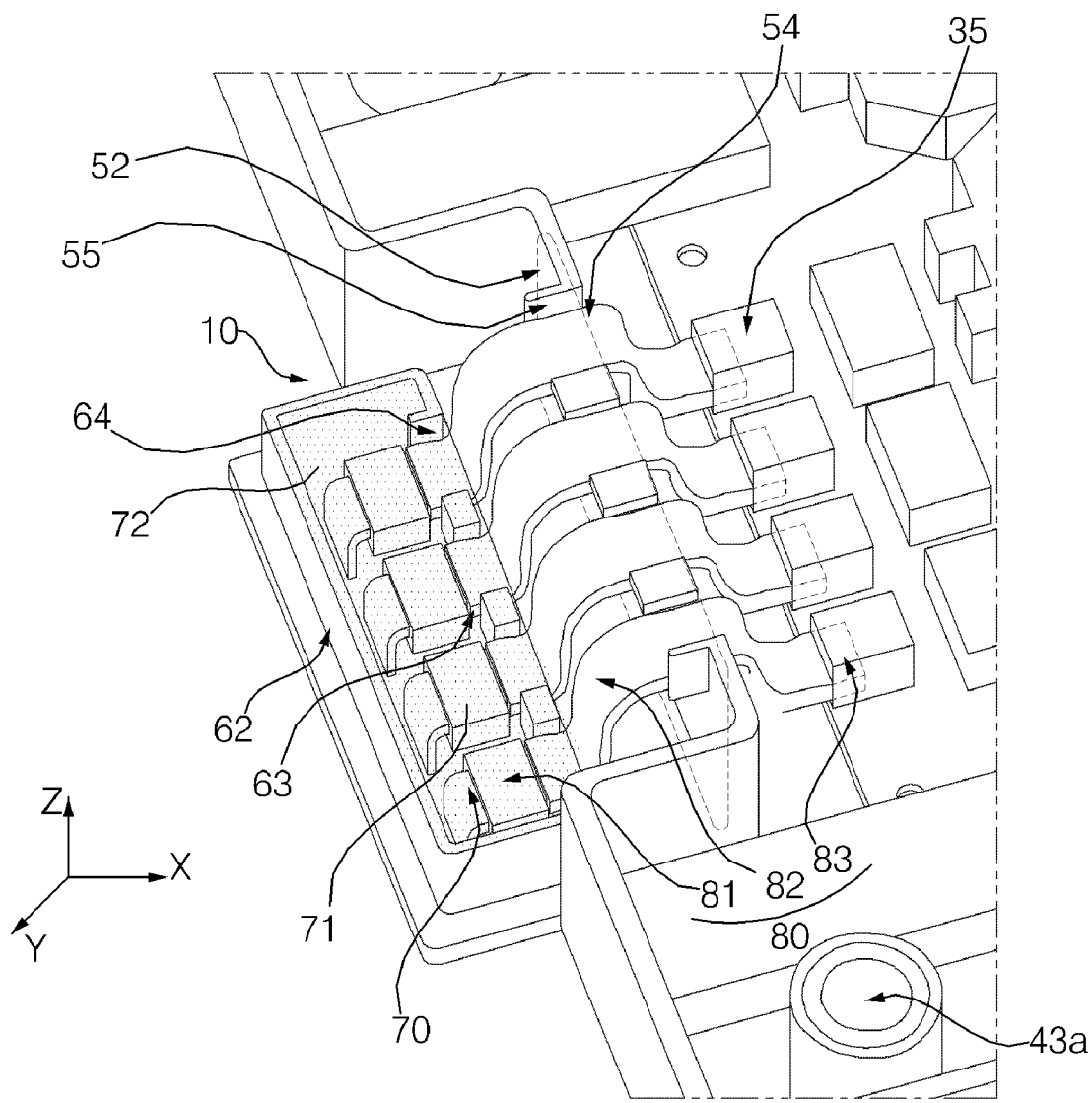

【 Fig 5 (b) 】
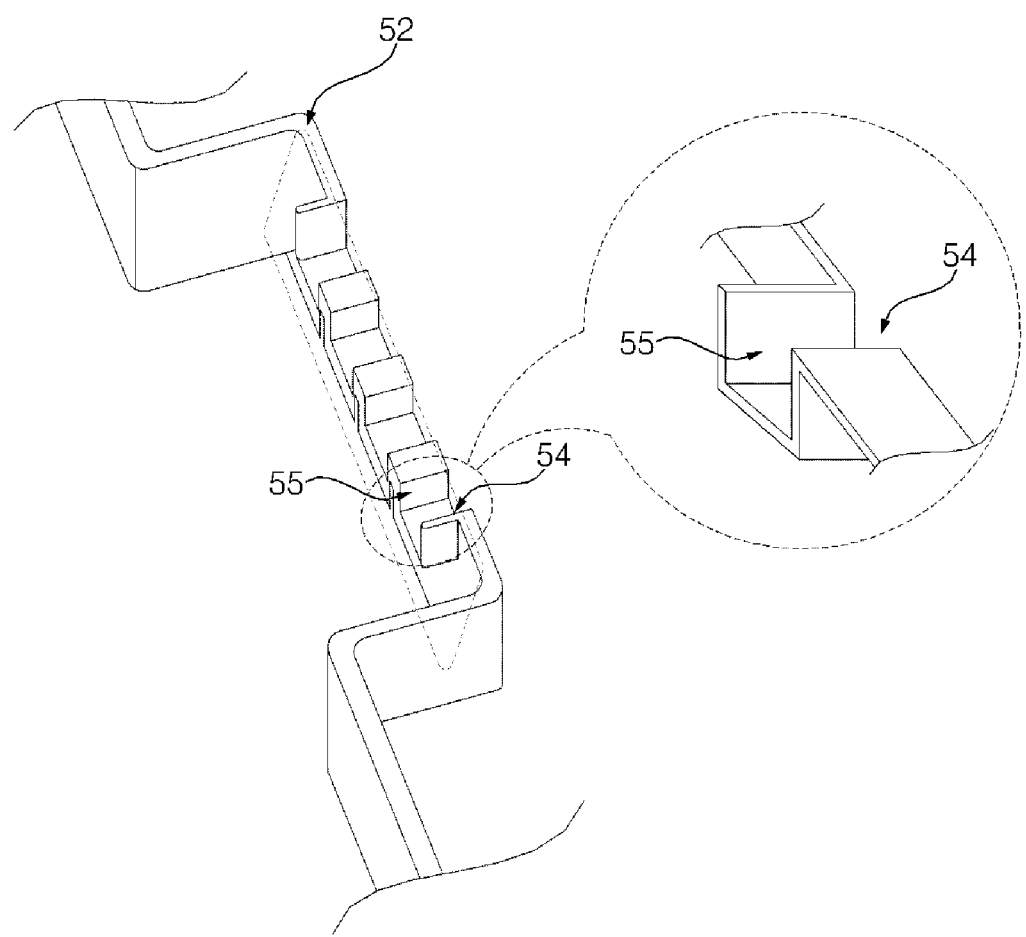

[Fig 6]
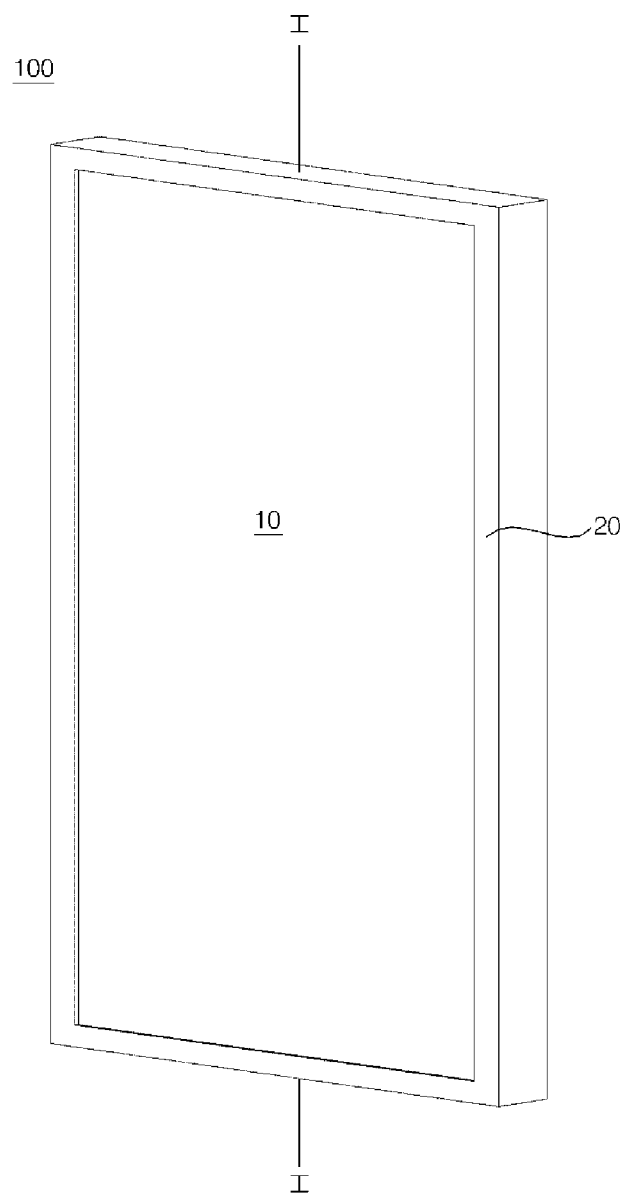

【 Fig 7 】
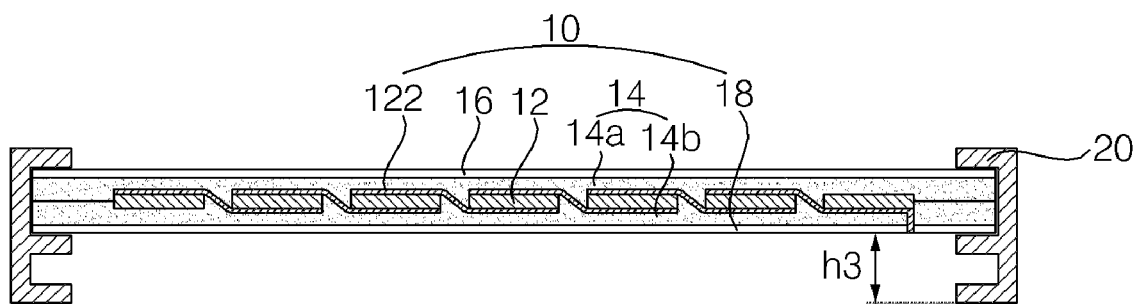

[Fig 8]
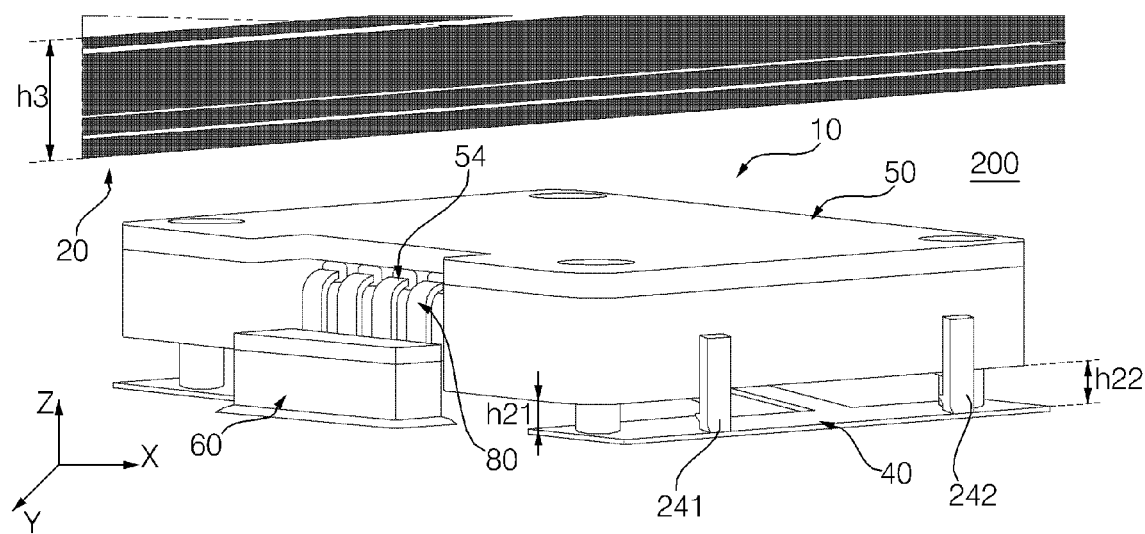

[Fig 9]
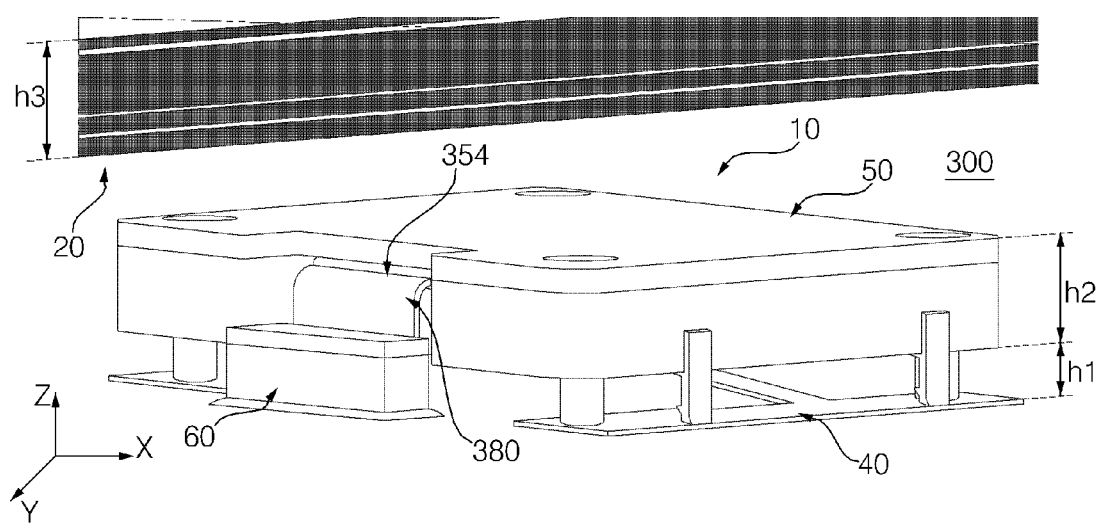

SOLAR CELL MODULE

CROSS-REFERENCE TO RELATED APPLICATION

This application claims the benefit of priority of Korean Patent Application No. 10-2016-0131504, filed on Oct. 11, 2016, in the Korean Intellectual Property Office, the disclosure of which is incorporated herein by reference.

BACKGROUND OF THE INVENTION

1. Field of the Invention

The present invention relates to a solar cell module. More particularly, the present invention relates to a solar cell module having a circuit unit, which includes an inverter and a bypass diode and is spaced apart from a solar cell panel.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A solar cell panel having a solar cell is connected to a junction box, and the junction box is connected to a direct current (DC)-alternating current (AC) inverter via a DC output cable protruding therefrom. Here, the junction box and the DC-AC inverter need to be separately manufactured and installed (for example, need to be separately manufactured and installed in separate cases), resulting in increased installation space and increased installation time when applied to a solar cell module. Thus, attempts to integrate the junction box and the inverter have been made.

In addition, because the junction box and the inverter may generate heat during operation and the generated heat may deteriorate the efficiency of the solar cell panel, effective methods of increasing heat dissipation efficiency are required.

SUMMARY OF THE INVENTION

One object of the present invention to be achieved is to provide a solar cell module, which exhibits excellent product reliability and is convenient to use.

Another object of the present invention to be achieved is to provide a solar cell band, which maintains excellent solar cell efficiency and has excellent adaptability.

A further object of the present invention to be achieved is to provide a solar cell module, which has excellent heat dissipation performance and may be easily replaced and installed.

In order to achieve the objects described above, the present invention provides some embodiments. Specifically, a solar cell module according to some embodiments of the present invention includes solar cell panel, a terminal housing configured to accommodate therein a plurality of terminals protruding from a rear surface of the solar cell panel, the terminal housing being attached to the rear surface of the solar cell panel, an inverter housing disposed so as to be spaced apart from the rear surface of the solar cell panel by a predetermined distance and configured to accommodate therein a circuit unit including a bypass diode that interconnects the terminals and a direct current (DC)-alternating current (AC) inverter that converts direct current output from the terminals into alternating current, and a ribbon exposed outward between the terminal housing and the inverter housing to transmit the output from the terminals to the circuit unit.

BRIEF DESCRIPTION OF THE DRAWINGS

The above and other objects, features and other advantages of the present invention will be more clearly understood from the following detailed description taken in conjunction with the accompanying drawings, in which:

FIG. 1(a) is a perspective view illustrating a solar cell module according to some embodiments of the present invention;

FIG. 1(b) is a perspective view illustrating the solar cell module according to some embodiments of the present invention before assembled;

FIG. 2 is a perspective view illustrating the arrangement of terminals and an inverter-fixing member included in the solar cell module according to some embodiments of the present invention;

FIG. 3 is another perspective view illustrating the solar cell module according to some embodiments of the present invention;

FIG. 4(a) is a perspective view illustrating a circuit unit included in the solar cell module according to some embodiments of the present invention;

FIG. 4(b) is a flowchart illustrating an exemplary flow sequence of current in the circuit unit included in the solar cell module according to some embodiments of the present invention;

FIG. 5(a) is an enlarged perspective view illustrating the portion in which ribbons are disposed in the solar cell module according to some embodiments of the present invention;

FIG. 5(b) is an enlarged perspective view illustrating a first opening and the portion in which the first opening is formed in the solar cell module according to some embodiments of the present invention;

FIG. 6 is a front perspective view illustrating the solar cell module according to some embodiments of the present invention;

FIG. 7 is a cross-sectional view of a solar cell panel taken along line I-I of FIG. 6;

FIG. 8 is a perspective view illustrating a solar cell module according to some embodiments of the present invention; and FIG. 9 is a perspective view illustrating a solar cell module according to some embodiments of the present invention.

DETAILED DESCRIPTION OF THE PREFERRED EMBODIMENTS

The advantages and features of the present invention and the way of attaining them will become apparent with reference to embodiments described below in detail in conjunction with the accompanying drawings. The present invention, however, is not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims. The same or extremely similar elements are designated by the same reference numerals throughout the specification.

In the drawings, to clearly illustrate several layers and areas, the thicknesses thereof are exaggerated. In addition, in the drawings, for convenience of description, some layers and areas are exaggerated.

In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween. In addition, it will be understood that, when an element such as a layer, film, region or substrate is referred to as being "under" another element, it can be directly under the other element or intervening elements may also be present. On the other hand, when an element such as a layer, film, region or substrate is referred to as being "directly under" another element, this means that there are no intervening elements therebetween.

Hereinafter, a solar cell module according to some embodiments of the present invention will be described in detail with reference to FIGS. 1 to 7.

FIG. 1 is a perspective view illustrating a solar cell module according to some embodiments of the present invention.

Specifically, FIG. 1(a) is a perspective view of the solar cell module, and FIG. 1(b) is a perspective view of the solar cell module before assembled.

FIG. 2 is a perspective view illustrating terminals and an inverter-fixing member included in the solar cell module according to some embodiments of the present invention.

Specifically, FIG. 2 is a perspective view illustrating the arrangement of the terminals and the inverter-fixing member included in the solar cell module.

FIG. 3 is another perspective view illustrating the solar cell module according to some embodiments of the present invention.

FIG. 4 is a perspective view illustrating a circuit unit included in the solar cell module according to some embodiments of the present invention.

Specifically, FIG. 4(a) is a perspective view illustrating the circuit unit included in an inverter housing, and FIG. 4(b) is a flowchart illustrating an exemplary flow sequence of current in the circuit unit illustrated in FIG. 4(a).

FIG. 5 is a perspective view illustrating the arrangement structure of ribbons included in the solar cell module according to some embodiments of the present invention.

Specifically, FIG. 5(a) is an enlarged perspective view illustrating the portion in which the ribbons are disposed in the solar cell module, and FIG. 5(b) is an enlarged perspective view illustrating a first opening and the portion in which the first opening is formed in the solar cell module.

FIG. 6 is a front perspective view illustrating the solar cell module according to some embodiments of the present invention.

FIG. 7 is a cross-sectional view of a solar cell panel taken along line I-I of FIG. 6.

Referring to FIG. 1(a), the solar cell module according to some embodiments of the present invention, designated by reference numeral 100, includes a solar cell panel 10, a terminal unit P1 protruding from the rear surface of the solar cell panel 10, an inverter unit P2 spaced apart from the rear surface of the solar cell panel 10 by a predetermined distance, and a ribbon 80 that electrically connects the terminal unit P1 and the inverter unit P2 to each other and has an area exposed outward between the terminal unit P1 and the inverter unit P2. Here, the inverter unit P2 is spaced apart from the rear surface of the solar cell panel 10 by a predetermined distance through the use of a separate fixing member.

Specifically, a terminal 70, which protrudes from the rear surface of the solar cell panel 10, is a lead-out for outwardly discharging the output of a plurality of solar cells, which constitutes the solar cell module 100, and takes the form of, for example, a metal ribbon connected to a solar cell string so as to protrude outward through, for example, a back sheet disposed on the rear surface of the solar cell panel 10. A plurality of terminals 70 is accommodated in a terminal housing 60, which surrounds the terminals 70 and is attached to the rear surface of the solar cell panel 10, in order to prevent, for example, the invasion of outside moisture.

The inverter unit P2 is spaced apart from the terminal housing 60 so as to be spaced apart from the rear surface of the solar cell panel 10 by a predetermined distance. The inverter unit P2 includes a circuit unit 30 and an inverter housing 50, which accommodates the circuit unit 30 therein, and the circuit unit 30 includes, for example, a bypass diode, which interconnects the terminals 70 and prevents current from reversing between solar cell strings, a converter, which converts direct current output from the solar cell panel 10, and a DC-AC inverter, which converts the output direct current into alternating current. The inverter housing 50 is spaced apart from the rear surface of the solar cell panel 10 by a predetermined distance using, for example, an inverter-fixing member 40, which includes a support portion 41. The inverter housing 50 may be firmly fixed to the inverter-fixing member 40 via a first fastening portion 43a (not illustrated) and a second fastening portion 43b. It is to be noted that the configuration of the solar cell module 100, the arrangement and coupling relationship of the respective components, and the like are not limited to that illustrated in the drawings, but may be easily modified and applied by those skilled in the art.

For example, the inverter housing 50 may be fixed by being coupled to a frame 20 so as to be spaced apart from the rear surface of the solar cell panel 10. Alternatively, the structure of the inverter housing 50 may be altered so as to maintain a predetermined distance from the rear surface of the solar cell panel 10 without using a separate fixing member.

More specifically, considering the solar cell module 100 with reference to FIG. 1(b), at least one terminal 70 is disposed on the rear surface of the solar cell panel 10 so as to protrude from the rear surface of the solar cell panel 10. The terminal 70 is accommodated in the terminal housing 60, which includes a terminal-housing outer wall 62 and a terminal-housing cover 61. The inverter-fixing member 40 includes the support portion 41, an inverter-fixing plate 42, the first fastening portion 43a, and the second fastening portion 43b. The support portion 41 causes the inverter housing 50, which accommodates the circuit unit 30 therein, to be spaced apart from the solar cell panel 10, and the first fastening portion 43a and the second fastening portion 43b realize the firm coupling of the inverter-fixing member 40 and the inverter housing 50. The circuit unit 30 and the terminal 70 are electrically connected to each other by the ribbon 80, which is exposed outward. It is to be noted that the shape, configuration or structure of the solar cell module 100 is not limited to that illustrated in the drawings, but may be easily modified and applied by those skilled in the art.

As described above, the terminal unit P1, the inverter unit P2, the inverter-fixing member 40, and the ribbon 80, which are included in the solar cell module 100, may be disposed on the rear surface of the solar cell panel 10. Hereinafter, the solar cell panel 10 and the frame 20 will be described with reference to FIGS. 6 and 7, the circuit unit and the inverter housing 50 will be described with reference to FIGS. 1 and 4, and the inverter-fixing member 40 will be described with reference to FIGS. 1 and 2. Then, the connection structure of the terminal 70, the terminal housing 60, the ribbon 80, the circuit unit 30, the inverter housing 50, and the solar cell panel 10 will be described in detail with reference to FIGS. 1, 2, 3 and 5.

Referring to FIGS. 6 and 7, the solar cell panel 10 includes at least one solar cell 12. In addition, the solar cell panel 10 may include a sealing layer 14 configured to surround and seal the solar cell 12, a front substrate 16 disposed on one surface of the sealing layer 14 at the front side of the solar cell 12, and a rear substrate 18 disposed on the other surface of the sealing layer 14 at the rear side of the solar cell 12.

In one example, the solar cell 12 may include a semiconductor substrate (for example, a monocrystalline or polycrystalline semiconductor substrate, more specifically, a monocrystalline or polycrystalline silicon wafer), first and second conductive areas formed in or on the semiconductor substrate and having opposite conductive types, and first and second electrodes connected respectively to the first and second conductive areas. Here, the semiconductor substrate may be doped with a p-type or n-type dopant at a low density, and one of the first and second conductive areas may be of a p-type and the other one may be of an n-type. In addition, the first or second conductive area may be configured with a doped area, which is formed by doping a portion of the semiconductor substrate with a dopant, or may be configured with a semiconductor layer, which is separately formed on the semiconductor substrate and is doped with a dopant. A plurality of solar cells 12 may be provided, and a first electrode of one solar cell 12 may be connected to a second electrode of another neighboring solar cell 12 via a ribbon 122 or the like so that the solar cells 12 are arranged in a line to form a solar cell string. It is to be noted that the structure of each solar cell 12, the connection structure of the respective solar cells 12, and the like are not limited to that illustrated in the drawings, but may be easily modified by those skilled in the art. In addition, although the drawing illustrates the plurality of solar cells 12 by way of example, only one solar cell 12 may be provided.

Referring again to FIGS. 6 and 7, the sealing layer 14 may include a first sealing layer 14*a* located between the solar cell 12 and the front substrate 16 and a second sealing layer 14*b* located between the solar cell 12 and the rear substrate 18, the first and second sealing layers 14*a* and 14*b* being bonded to each other. The sealing layer 14 surrounds and seals the solar cell 12 to thereby block moisture or oxygen, which may have a negative effect on the solar cell 12. In addition, the sealing layer 14 chemically couples the constituent elements of the solar cell module 100 (i.e. the front substrate 16, the solar cell 12, and the rear substrate 18). The rear substrate 18, the second sealing layer 14*b*, the solar cell 12 or the solar cell string, the first sealing layer 14*a*, and the front substrate 16 may be integrally formed through, for example, a lamination process of sequentially stacking them one above another and bonding them to one another by applying heat and/or pressure thereto.

The first sealing layer 14*a* and the second sealing layer 14*b* may be formed of ethylene vinyl acetate (EVA) copolymer resin, polyvinyl butyral, silicone resin, ester-based resin, olefin-based resin, or the like. Here, the first sealing layer 14*a* and the second sealing layer 14*b* may be formed of the same material, or may be formed of different materials. However, the present invention is not limited thereto. Thus, the first and second sealing layers 14*a* and 14*b* may be formed using any of various materials via any of various methods, rather than lamination.

The front substrate 16 is disposed on the first sealing layer 14*a* and configures the front surface of the solar cell panel 10. The front substrate 16 may be formed of a light-transmitting material capable of transmitting light and may have a strength required to protect the solar cell 12 from an external shock, etc. In one example, the front substrate 16 may be configured with a glass substrate. Here, the front substrate 16 may be configured with a tempered glass substrate in order to increase the strength thereof. Various other alterations of the front substrate 16 are possible. For example, the front substrate 16 may additionally include various materials capable of improving various properties. Alternatively, the front substrate 16 may be a sheet or a film formed of, for example, a resin. That is, it is to be noted that the material of the front substrate 16 is not limited to the description, but may be easily modified by those skilled in the art.

The rear substrate 18 may be disposed on the second sealing material 14*b* and may serve as a layer that is disposed on the rear side of the solar cell 12 so as to protect the solar cell 12. The rear substrate 18 may have water-proofing, electrical insulation, and ultraviolet blocking functions.

The rear substrate 18 may have a strength required to protect the solar cell 12 from an external shock, etc., and may transmit or reflect light depending on a desired structure of the solar cell panel 10. In one example, in the structure of introducing light through the rear substrate 18, the rear substrate 18 may be formed of a light-transmitting material. In the structure of reflecting light from the rear substrate 18, the rear substrate 18 may be formed of a light-reflecting material, or a material that does not transmit light. In one example, the rear substrate 18 may be configured with a glass substrate, or may be configured with a film or sheet. For example, the rear substrate 18 may be of a Tedlar/PET/Tedlar (TPT) type, or may be formed of a polyvinylidene fluoride (PVDF) resin formed on at least one surface of polyethylene terephthalate (PET). Polyvinylidene is a polymer having the structure of $(CH_2CF_2)n$, which is a double fluorine molecular structure, and thus has excellent mechanical, weather-proofing, and ultraviolet-resistant properties. It is to be noted that the material of the rear substrate 18 is not limited to the description, but may be easily modified by those skilled in the art.

In order to stably fix the solar cell panel 10, which is configured into multiple layers as described above, the frame 20 may be located so that the outer peripheral portion of the solar cell panel 10 is fixed to the frame 20. Referring to FIG. 6, although the entire outer peripheral portion of the solar cell panel 10 is illustrated as being fixed to the frame 20, the shape and structure of the frame of the present invention are not limited to that illustrated in the drawings, but may be easily modified by those skilled in the art.

The inverter according to some embodiments of the present invention is an integrated combination of at least a portion of a conventional junction box (bypass diode) and at least a portion of a conventional inverter. Thus, the inverter may be called a junction box circuit unit, a bypass diode circuit unit, an integral junction box, an inverter integrated junction box, or the like. A combination of the circuit unit 30 and the inverter housing 60 is called the inverter unit P2, and the inverter unit P2 will be described below in more detail with reference to FIGS. 1 and 4.

FIG. 4(a) is a perspective view of the circuit unit 30 included in the solar cell module 100 illustrated in FIG. 1, and FIG. 4(b) is a flowchart illustrating an exemplary flow sequence of current in the circuit unit 30.

Referring to FIGS. 4(a) and 4(b), the circuit unit 30 includes an inverter 31 and a bypass diode 33. Specifically, the bypass diode 33 is disposed between terminals through which the output of the solar cell panel 10 is discharged. In an embodiment of the present invention, the bypass diode 33 is disposed on a circuit board 34 and is connected to a second connection terminal 35 via a circuit pattern, which extends from the second connection terminal 35. Each bypass diode 33 may be located between two second connection terminals 35 and may be connected to the two second connection terminals 35 via a circuit pattern. When a region where power generation does not occur is formed because a portion of the solar cell panel 10 is hidden or due to occurrence of breakdown or the like, the bypass diode 33 serves to protect the corresponding region by causing current to bypass the region. The bypass diode 33 may have any one of various known structures.

A DC-DC converter converts direct current to a predetermined level, and a DC-AC inverter converts the direct current into alternating current. As such, the direct current output from the solar cell is transmitted outward as alternating current output by way of the DC-DC converter and the DC-AC inverter.

In an embodiment of the present invention, a DC-DC converter 358 and a DC-AC inverter 352 are disposed on the circuit board 34 and are connected to the bypass diode 33 via a circuit pattern, which extends from the bypass diode 33.

The output from the solar cell panel 10 may be transmitted to the DC-DC converter 358 to thereby be converted into a DC voltage having a predetermined level. In the present embodiment, a plurality of DC-DC converters 358 may be provided. When the plurality of DC-DC converters 358 is provided, the thickness of each DC-DC converter 358 may be reduced, compared to the case where only one DC-DC converter is provided. Thereby, the thickness of the circuit unit 30 may be appropriately controlled. However, the present invention is not limited thereto, and one DC-DC converter may be provided.

The voltage or current, the level of which has been converted by the DC-DC converter 358, is converted into alternating current or an AC voltage by the DC-AC inverter 352.

Specifically, the inverter 31 may include, for example, a current sensor 354 and a capacitor 356, in addition to the DC-AC inverter 352, in order to stably convert direct current into alternating current. The current sensor 354, the capacitor 356, the DC-DC converter 358, and the DC-AC inverter 352, which constitute the inverter 31, may be integrated with the bypass diode 33 and/or the second connection terminal 35 via the circuit board 34 or the circuit pattern formed thereon.

The current sensor 354 may be connected to the bypass diode 33 by the circuit pattern formed on the circuit board 34 within the inverter housing 50. Through the connection of the bypass diode 33 and the current sensor 354, for example, a separate output cable may not be necessary, which may result in a simplified structure.

In addition, the current sensor 354 is connected to the capacitor 356, which stores the direct current that has passed through the current sensor 354 and transmits the current corresponding to a predetermined voltage to the DC-DC converter 358. Similarly, the current sensor 354 and the capacitor 356 may be connected to each other via the circuit pattern formed on the circuit board 34 within the inverter housing 50.

The current that has attained an even voltage in the capacitor 356 may be transmitted to the DC-DC converter 358 to thereby be converted into a DC voltage having a predetermined level. In the present embodiment, the plurality of DC-DC converters 358 may be provided. When the plurality of DC-DC converters 358 is provided, the thickness of each DC-DC converter 358 may be reduced, compared to the case where only one DC-DC converter is provided. Thereby, the thickness of the circuit unit 30 may be appropriately controlled. However, the present invention is not limited thereto, and one DC-DC converter may be provided.

The direct current or the DC voltage that has passed through the DC-DC converter 358 may be transmitted to the DC-AC inverter 352 to thereby be converted into alternating current or an AC voltage. The resulting alternating current or AC voltage is transmitted outward by an AC output cable 38, which passes through a through-hole 39 formed in the inverter housing 50. For example, the output may be transmitted to the solar cell module 100 via the AC output cable 38, or may be transmitted to a power network, a power system or the like.

The DC-AC inverter 352, the current sensor 354, the capacitor 356, and the DC-DC converter 358 may have any one of various known structures. In addition, the circuit unit of the inverter unit P2 may include, for example, a control member and a communication member.

It is to be noted that the respective components disposed on the circuit board 34 and the structures thereof are not limited to the description or to that illustrated in the drawings, but may be easily modified by those skilled in the art.

As described above, in the present embodiment, the circuit unit 30 is configured such that the bypass diode 33 is integrated with the other inner circuit components, and therefore may be distinguished from the related art in which a second connection terminal, a bypass diode, and an inverter are separately formed.

In the specification of the present invention, the term "integrated" may include all states in which a plurality of elements, articles, objects, or members is recognized as one element, article, object or member when fixed to the solar cell panel 10 and/or the frame 20 during or after installation. For example, when a plurality of elements is integrated, this may mean that the elements are located together in the same case so as to be integrated via the case, may mean that the elements are fixed to the same member via fitting, attachment or the like so as to be integrated by the member, may mean that the elements are formed together on the same member so as to constitute a portion of the same member, or may mean that the elements are surrounded or fixed together by the same member. On the other hand, when a plurality of elements is interconnected via a separate output cable or the like, it may not be appropriate to state that the elements are integrated with each other. Here, the second connection terminal 35, the bypass diode 33, and the inverter 31 may be integrated so as to be inseparable, or may be integrated so as to be easily separated for repair or replacement thereof.

As described above, in the circuit unit 30 according to some embodiments of the present invention, the second connection terminal 35, the bypass diode 33, and the inverter 31 are formed together on the circuit board 34 having the circuit pattern thereon. Thereby, the second connection terminal 35, the bypass diode 33, and the inverter 31 may be seen as being integrated by the circuit board 34.

It is to be noted that the integration of the second connection terminal 35, the bypass diode 33, and the inverter 31 via the circuit board 34 as described is not limiting, but may be easily altered by those skilled in the art.

In addition, as illustrated in FIGS. 1 and 4(a), the inverter housing 50 accommodates the circuit unit 30 therein. For example, the circuit unit 30 may be accommodated in the inverter housing 50, and a second sealing material 32 may be located between the circuit unit 30 and the inverter housing 50 so as to cover or surround the circuit unit 30.

Some embodiments of the present invention illustrate that the second connection terminal 35, the bypass diode 33, and the inverter 31 are integrated by the same circuit board 34, the same sealing material 32, and the same inverter housing 50. More specifically, the second connection terminal 35, the bypass diode 33, and the inverter 31 may be disposed on the same circuit board 34, the circuit board 34 may be fixed inside the inverter housing 50, and the second sealing material 32 may fill the space between the inverter housing 50 and the circuit unit 30 excluding the region that corresponds to the second connection terminal 35. Thereby, the second connection terminal 35, the bypass diode 33, and the inverter 31 may be more firmly integrated, and the circuit unit 30 may be protected from external moisture and contaminants. In addition, when the second sealing material is not provided in the region that corresponds to the second connection terminal 35, a process of connecting the ribbon 80 and the second connection terminal 35 to each other may be more easily performed. It is to be noted that the structure by which the circuit unit 30 is accommodated in the inverter housing 50 and a connection relationship between the components are not limited to the description, but may be easily modified by those skilled in the art.

In some embodiments of the present invention, the inverter housing 50 may provide the space in which the circuit unit 30 is located, and may achieve a reduction in weight and increased heat dissipation, thereby ensuring high efficiency of the solar cell module 100.

Specifically, referring again to FIG. 1(b), the inverter housing 50, which accommodates the circuit unit 30 therein, includes a first inverter-housing portion 53 disposed between the circuit unit 30 and the solar cell panel and a second inverter-housing portion 51 configured to cover the first inverter-housing portion 53.

Specifically, the inverter housing 50 may include the first inverter-housing portion 53 and the second inverter-housing portion 51, and the first inverter-housing portion 53 may be separated from the second inverter-housing portion 51, which may ensure the easy management, repair, and replacement of the circuit unit 30.

In addition, the inverter housing 50 may be formed of glass, plastic or metal. For example, when the inverter housing 50 is formed of glass, the easy management and inspection of elements or members inside the inverter housing 50 from the outside may be possible due to good visibility. When the inverter housing 50 is formed of plastic, the weight of the inverter housing 50 may be reduced. When the inverter housing 50 is formed of metal, heat dissipation may be maximized due to good thermal conductivity. In addition, the first inverter-housing portion 53 and the second inverter-housing portion 51 may be formed of different materials. For example, when the first inverter-housing portion 53 is formed of glass and the second inverter-housing portion 51 is formed of metal, the management and inspection of the circuit unit 30 from the outside may be easy and heat dissipation through the second inverter-housing portion 51 may be increased.

It is to be noted that the configuration, structure, material and the like of the inverter housing 50 are not limited to the description, and may include the range that may be easily modified or applied by those skilled in the art.

In the solar cell module 100 according to some embodiments of the present invention, the inverter housing 50, which accommodates the circuit unit 30 therein, may be spaced apart from the solar cell panel 10 by the inverter-fixing member 40 (more particularly, the support portion 41), which may maximize heat dissipation by the inverter housing 50. Hereinafter, the inverter-fixing member 40 will be described in detail with reference to FIGS. 1(b) and 2.

Referring to FIGS. 1(b) and 2, the inverter-fixing member 40 is disposed on the rear surface of the solar cell panel 10. Specifically, referring to FIG. 2, the inverter-fixing member 40 includes the inverter-fixing plate 42, the support portion 41, the first fastening portion 43a, and the second fastening portion 43b (not illustrated). More specifically, the inverter-fixing plate 42 is disposed on the rear surface of the solar cell panel 10, and the support portion 41, the first fastening portion 43a and the second fastening portion 43b (not illustrated) are coupled to the inverter-fixing plate 42.

The inverter-fixing plate 42 may serve as a basic frame of the inverter-fixing member 40 and may also serve to stably couple the inverter-fixing member 40 to the solar cell panel 10. The inverter-fixing plate 42 may be formed of plastic. It is to be noted that the role and material of the inverter-fixing plate 42 are limited to the description, but may be easily modified by those skilled in the art.

The inverter-fixing plate 42 may have a plate shape, rather than being formed in an "H"-shaped form illustrated in FIG. 2. It is to be noted that the shape of the inverter-fixing plate 42 is not limited to the description or to that illustrated in the drawings, but may be easily changed depending on the type and size of the circuit unit 30, which will be described later, by those skilled in the art. Moreover, the inverter-fixing plate 42 may be separably coupled to the solar cell panel 10. Specifically, the inverter-fixing plate 42 may be separably coupled to the rear surface of the solar cell panel 10 via screws or some other fastening structure, and through the provision of the separable inverter-fixing plate 42, the inverter-fixing member 40 may be easily replaced or changed so as to match the size and shape of the circuit unit 30. It is to be noted that the coupling configuration and the coupling structure between the inverter-fixing plate 42 and the solar cell panel are not limited to the description, but may be easily modified by those skilled in the art.

The inverter-fixing member 40 may be provided with the support portion 41. For example, at least two support portions 41 may be symmetrically disposed.

The support portion 41 may serve to space the inverter housing 50 apart from the rear surface of the solar cell panel 10 by a predetermined distance and to stably fix the inverter housing 50 to the solar cell panel 10.

Specifically, the inverter housing 50 may be separably coupled to the support portion 41, or may be attached to the support portion 41 via bonding or the like.

It is to be noted that the coupling relationship and structure between the inverter housing 50 and the support portion 41 are not limited to the description, but may be easily modified by those skilled in the art.

That is, the inverter housing 50 may be coupled to the frame 20 without a separate fixing member that is attached to a substrate of the solar cell panel 10 so as to be supported to have a predetermined distance from the substrate, or may be coupled using both the fixing member and the frame 20. In addition, in some cases, the rear surface of the inverter housing 50 may be changed in shape and may be attached to the rear surface of the solar cell panel 10 so as to be spaced apart from the substrate by a predetermined distance.

Referring again to FIGS. 1(b) and 2, the inverter housing 50, in which the circuit unit 30 having the bypass diode 33 and the inverter 31 is accommodated, is spaced apart from the solar cell panel 10 by the support portion 41 and is firmly fixed to the inverter-fixing member 40 by the first fastening portion 43a and the second fastening portion 43b.

Specifically, the inverter housing 50 may have an opening in the portion thereof that corresponds to the first fastening portion 43a, and the inverter-fixing member 40 and the inverter housing 50 may be fixed to each other as the first fastening portion 43a passes through the opening and the second fastening portion 43b is coupled to the first fastening portion 43a that has passed through the opening. It is to be noted that the coupling configuration and coupling structure of the inverter housing 50 and the inverter-fixing member 40 are not limited to the description or to that illustrated in the drawing, but may be easily modified by those skilled in the art.

As described above, the inverter housing 50 may be spaced apart from the solar cell panel 10 by the inverter-fixing member 40, which may increase the heat dissipation efficiency of the solar cell module 100.

Referring again to FIG. 3, the height h1 from the rear surface of the solar cell panel 10 to the inverter housing 50 is set so as to reduce the generation of heat between the circuit unit 30 and the solar cell panel 10 by the flow of air in the space. For example, when the height h1 is equal to or less than the height h3 from the rear surface of the solar cell panel 10 to the upper surface of the frame 20, which is fixed to the outer periphery of the solar cell panel 10, in addition to excellent heat dissipation as described above, easy storage and installation of the solar cell panel and high durability of the solar cell panel 10 may be realized.

Specifically, the inverter housing 50 may be spaced apart from the rear surface of the solar cell panel 10 by a distance h1 ranging from about 5 mm to about 50 mm.

When the distance between the rear surface of the solar cell panel 10 and the inverter housing 50 is maintained within the above-described range, excellent heat dissipation as well as high durability and easy installation of the solar cell module 100 may be realized. When the distance between the rear surface of the solar cell panel 10 and the inverter housing 50 is below the above-described range, heat dissipation may be deteriorated. When the distance between the rear surface of the solar cell panel 10 and the inverter housing 50 exceeds the above-described range, the durability of the solar cell module 100 may be deteriorated.

In addition, referring again to FIG. 3, the inverter housing 50 may have a height h2 ranging from about 10 mm to about 50 mm in a second direction (the z-axis direction). When the height h2 of the inverter housing 50 is maintained within the above-described range in the second direction (the z-axis direction), the size of the inverter housing 50 in which the circuit unit 30 is accommodated may be reduced while ensuring high durability of the solar cell module 100.

As a result, the excellent heat dissipation and high durability of the solar cell module 100 and a reduction in the size of the inverter housing 50 may be realized by controlling the distance d1 from the rear surface of the solar cell panel 10 to the lower surface of the inverter housing 50 and the height h2 of the inverter housing 50 in the second direction (the z-axis direction).

In some embodiments of the present invention, the terminal 70 may function to transmit current generated in the solar cell panel 10 to the circuit unit 30 and may be formed of a conductive metal. It is to be noted that the material of the terminal 70 is not limited to the description, but may be easily modified by those skilled in the art.

The terminal 70 may protrude from the rear surface of the solar cell panel 10 and may be spaced apart from the circuit unit 30 so that the terminal 70 and the circuit unit 30 are electrically connected to the ribbon 80. Specifically, referring to FIGS. 1(b) and 2, at least one terminal 70 protrudes from the rear surface of the solar cell panel 10 and is spaced apart from the circuit unit 30 so as not to overlap the circuit unit 30.

More specifically, a rear surface area 36 may be defined on the rear surface of the solar cell panel 10 so as to correspond to the inverter housing 50, and the terminal 70 may be disposed outside the rear surface area 36 of the solar cell panel 10 that corresponds to the inverter housing 50.

Because the terminal 70 is spaced apart from the circuit unit 30, rather than being in direct contact with circuit unit 30, and protrudes from the rear surface of the solar cell panel 10, ease in the management and replacement of the circuit unit 30 may be facilitated.

For example, when the terminal 70 is not spaced apart from the circuit unit 30, but overlaps the circuit unit 30, the circuit unit 30 may need to be separated when the terminal 70 breaks down, which is inconvenient, and it may be difficult to observe the connection relationship between the circuit unit 30 and the terminal 70. On the other hand, when the terminal 70 is spaced apart from the circuit unit 30 so as not to overlap the circuit unit 30, the terminal 70 and the circuit unit 30, which are separated from each other, may exhibit easy management or replacement thereof.

In addition, the terminal 70 may be accommodated in the terminal housing 60. Specifically, referring to FIGS. 1(b), and 5(a), the terminal 70 may be accommodated in the terminal housing 60 while being coupled to or not coupled to a first connection terminal 71, the space inside the terminal housing 60 may be filled with a first sealing material 72, and the terminal housing 60 may include a terminal-housing outer wall 62 and a terminal-housing cover 61.

Because the terminal 70 is accommodated in the terminal housing 60, which is filled with the first sealing material 72, the terminal 70 may be protected from an external shock and contaminants. Specifically, because the terminal 70 is coated with the first sealing material 72 and is accommodated in the terminal housing 60, the terminal 70 may be stably disposed within the terminal housing 60 and may be protected from external moisture or contaminants. In addition, because the terminal housing 60 includes the terminal-housing outer wall 62 and the terminal-housing cover 61 and the terminal-housing cover 61 is separable from the terminal-housing outer wall 62, easy management, repair, and replacement of the terminal housing 60 may be possible. It is to be noted that the terminal 70 accommodated in the terminal housing 60 is not limited to the description, but may be easily modified by those skilled in the art. For example, the terminal 70 may not be coated with the sealing material 72, but may be surrounded by a separate insulating coating.

In addition, each of the terminal-housing cover 61 and the terminal-housing outer wall 62 may be formed of glass, plastic or metal. For example, when the terminal-housing cover 61 is formed of glass, the easy management and inspection of elements or members inside the terminal housing 60 from the outside may be possible due to good visibility. When the terminal-housing outer wall 62 is formed of plastic, the terminal housing 60 may be reduced in weight. It is to be noted that the components of the terminal housing 60, the coupling relationship between the components, and the material of the components are not limited to the description or to that illustrated in the drawings, but may be easily modified by those skilled in the art.

In some embodiments of the present invention, the solar cell module 100 includes the ribbon 80, which is exposed outward between the terminal housing 60 and the inverter housing 50 and transmits the output from the terminal 70 to the inverter unit P2. Specifically, referring to FIG. 5(a), the first connection terminal 71 coupled to the terminal 70 and the second connection terminal 35 of the circuit unit 30 are electrically connected to each other by the ribbon 80. More specifically, a first ribbon end 83 is connected to the second connection terminal 35 of the circuit unit 30, an intermediate ribbon portion 82 extends along a first opening 54 and a second opening 63, and a second ribbon end 81 is electrically connected to the first connection terminal 71 coupled to the terminal 70.

The electrical connection of the terminal 70 and the inverter unit P2 by the ribbon 80 may be realized by soldering the ribbon 80, which extends from the inverter unit P2, to the first connection terminal 71, or by connecting the ribbon 80 to the first connection terminal 71 using a clip or some other structure, or may alternatively be realized by soldering the ribbon 80, which extends from the terminal 70, to the second connection terminal 35, or by connecting the ribbon 80 to the second connection terminal 35 using a clip or some other structure. The ribbon 80 may be formed of a conductive metal, in the same manner as the terminal 70, which protrudes from the solar cell panel 10, without being limited thereto. Because the ribbon 80 has an area that is exposed to the outer space, rather than being located in the terminal housing 60 or the inverter housing 50, at least the exposed area of the ribbon 80 may be coated with an insulating material, or may be surrounded by an insulating coating, in order to prevent the invasion of moisture or the like and to secure safety. The ribbon 80 may be formed of a flexible material, in order to accommodate the difference in height between the terminal 70 and the inverter unit P2.

That is, because the terminal 70 and the circuit unit 30 are spaced apart from each other so as not to overlap each other, the terminal 70 and the circuit unit 30 are connected to each other by the ribbon 80, and as a result, each of the inverter housing 50 and the terminal housing 60 may have the first opening 54 or the second opening 63, through which the ribbon 80 passes. It is to be noted that the connection structure or the like of the terminal 70, the circuit unit 30 and the ribbon 80 is not limited to the description or to that illustrated in the drawings, but may be easily modified by those skilled in the art.

Next, the first opening 54 will be described with reference to FIGS. 5(a) and 5(b).

As described above, the inverter housing 50 includes at least one first opening 54, through which the ribbon 80 passes. Specifically, the inverter housing 50 has the first opening formed in the side surface thereof that faces the terminal 70.

Referring to FIG. 5(a), the first opening 54 is located in a ribbon-accommodating portion 52 of the side surface of the inverter housing 50 that faces the terminal 70 to allow the ribbon 80 to pass therethrough.

Specifically, referring to FIG. 5(b), the first opening 54 is defined by a first protrusion 55, which protrudes from the side surface of the inverter housing 50 that faces the terminal 70 so as to correspond to the ribbon 80 that passes through the side surface. The first protrusion 55 has four sides, which are configured to surround the first opening 54 and protrude from the side surface of the inverter housing 50 (the top surface of the first protrusion 55 is not illustrated).

When the first opening 54 is formed in the side surface of the inverter housing 50 that faces the terminal 70, the amount of the ribbon 80 that is used may be reduced, enabling a reduction in production costs. In addition, when the first opening 54 is defined by the first protrusion 55, the ribbon 80, which passes through the first opening 54, may be stably disposed.

It is to be noted that the structure and positional relationship of the first opening 54 and the first protrusion 55 are not limited to the description or to that illustrated in the drawings, but may be easily modified by those skilled in the art.

Similarly to the first opening 54, the second opening 63, through which the ribbon 80 connected to the terminal 70 passes, may be formed in the side surface of the terminal housing 60 that faces the inverter housing 50, and may be defined by a second protrusion 64, which protrudes from the side surface of the terminal housing 60. The second opening 63 has a structure and characteristics similar to those of the first opening 54, and unless otherwise mentioned, the structure and characteristics of the first opening 54 may be applied to the second opening 63.

In some embodiments of the present invention, the second opening 63 may have a height lower than the height of the first opening 54 in the second direction (the z-axis direction) from the rear surface of the solar cell panel 10. Specifically, referring again to FIG. 3, the first opening 54, through which the ribbon 80 passes, has a height higher than the second opening 63 (not illustrated) in second direction (the z-axis direction) from the rear surface of the solar cell panel 10. When the height of the first opening 54 in second direction from the rear surface of the solar cell panel 10 is higher than the height of the second opening 63, the circuit unit 30 may maintain a sufficient distance from the solar cell panel 10 and the stability of coupling between the ribbon 80 and the circuit unit 30 may be increased.

In some embodiments of the present invention, the ribbon 80 electrically connects the terminal 70 and the circuit unit 30 to each other, as described above.

Referring again to FIG. 5(a), the ribbon 80 is formed of a conductive metal and transmits the output of the solar cell panel 10 to the circuit unit 30, and at least the outwardly exposed area of the ribbon 80, excluding opposite ends of the ribbon 80 connected to the terminal 70 and the inverter unit P2, is covered with a protective layer. Specifically, the ribbon 80 includes the first ribbon end 83, the intermediate ribbon portion 82, and the second ribbon end 81, the first ribbon end 83 and the second ribbon end 81 are not covered with the protective layer, and the intermediate ribbon portion 82 is covered with the protective layer. Herein, opposite ends of the ribbon 80 are collectively referred to as the first ribbon end 81 and the second ribbon end 82.

The protective layer, which covers the intermediate ribbon portion, may be formed of an insulating material such as silicon or rubber, and may function to protect the ribbon 80 from an external shock or contaminants. The first ribbon end 83 and the second ribbon end 81 may be conductive metal portions, which are not covered with the protective layer, and may be electrically connected to the second connection terminal 35 of the circuit unit 30 and the first connection terminal 71. In the present embodiment, because the ribbon 80 is coupled to the first connection terminal 71 and the second connection terminal 35 so as to electrically connect the same to each other, the stability of coupling may be increased.

Specifically, each of the first ribbon end 83 and the second ribbon end 81 may be separably coupled to the second connection terminal 35 or the first connection terminal 71. For example, the first ribbon end 83 and the second connection terminal 35 may be separably coupled to each other by a clamp structure, a latch structure or the like. When the first ribbon end 83 and the second connection terminal 35 are separably coupled to each other, the repair and replacement of each of the ribbon 80 and the circuit unit 30 may be easily achieved.

It is to be noted that the protective layer of the ribbon 80, the coupling structure between the ribbon 80 and the first and second connection terminals 71 and 35, and the like are not limited to the description or to that illustrated in the drawings, but may be easily modified by those skilled in the art.

For example, when the first and second connection terminals 71 and 35 are not included, the first and second ribbon ends 83 and 81 may be directly connected to the circuit unit 30 and the terminal 70. Specifically, opposite ends of the ribbon 80 may be configured with metal pads, soldering pads or the like so as to be fixed to the terminal 70 or the circuit unit 30 via welding, soldering or the like. Thereby, the structure of the ribbon 80 may be simplified and the cost may be reduced.

In some embodiments of the present invention, the length of the exposed area of the ribbon 80 may be greater than the shortest length of a path that connects the terminal 70, the second opening 63, the first opening 54, and the circuit unit 30. For example, when the length of the exposed area of the ribbon 80 is greater than the shortest length of the path that connects the terminal 70, the second opening 63, the first opening 54, and the circuit unit 30, the ribbon 80 may stably connect the terminal 70 and the circuit unit 30 to each other even if one of the components is moved due to an external shock, the replacement thereof or the like.

In addition, the length of the outwardly exposed area of the ribbon 80 is equal to or greater than half the distance between the rear surface of the solar cell panel 10 and the inverter unit P2. When the length of the outwardly exposed area of the ribbon 80 is less than half the distance, the terminal 70 and the inverter unit P2 are located excessively close to each other, which may make the assembly of a module difficult and may cause deterioration in structural stability due to the tension of the ribbon 80. Next, a solar cell module 200 according to some embodiments of the present invention will be described with reference to FIG. 8.

The solar cell module 200 according to the present embodiment is substantially the same as the solar cell module 100 described above with reference to FIGS. 1 to 7, except that the distance from the rear surface of the solar cell panel 10 to the rear surface of the inverter housing 50 is not consistent.

Thus, the same reference numerals will be given to the same components, and a repeated description of the same components will be omitted below. The following description is focused on the differences between the present embodiment and the above-described embodiment.

Referring to FIG. 8, the solar cell module 200 according to the present embodiment includes a short support portion 241 and a long support portion 242, which have different heights in the second direction (the z-axis direction). Specifically, when the inverter housing 50 is disposed on the short support portion 241 and the long support portion 242, the inverter housing 50 may not be parallel to the solar cell panel 10, but may be oblique relative thereto. As a result, the distance between the solar cell panel 10 and the inverter housing 50 may include the shortest first distance h21 and the longest second distance h22.

It is to be noted that the arrangement sequence and arrangement positions of the short support portion 241 and the long support portion 242, the positional angle of the inverter housing 50, and the ranges of the first distance h21 and the second distance h22 are not limited to the description or to that illustrated in the drawings, but may be easily modified by those skilled in the art.

When the distance between the solar cell panel 10 and the inverter housing 50 is distributed within a predetermined range, heat dissipation may be maximized. Specifically, in consideration of the extent to which heat is generated inside the circuit unit 30, the distance between the solar cell panel 10 and the inverter housing 50 may be increased in the portions in which a large amount of heat is generated, and as a result, heat dissipation by the solar cell module 200 may be maximized.

Next, a solar cell module 300 according to some embodiments of the present invention will be described with reference to FIG. 9.

The solar cell module 300 according to the present embodiment is substantially the same as the solar cell module 100 described with reference to FIGS. 1 to 7, except that a ribbon, a first opening, and a second are integrated with one another.

Thus, the same reference numerals will be given to the same components, and a repeated description of the same components will be omitted below. The following description is focused on the differences between the present embodiment and the above-described embodiment.

Referring to FIG. 9, the solar cell module 300 according to the present embodiment includes an integrated ribbon 380. The integrated ribbon 380 may be connected to the second connection terminal 35 of the circuit unit 30, and may sequentially pass through an integrated first opening 354 and an integrated second opening 363 (not illustrated) to thereby be connected to the terminal 70. When the solar cell module 300 includes the integrated ribbon 380, the operation, installation and replacement of the ribbon 380 may be simplified, and the possibility of short-circuiting of the ribbon 380 may be reduced, compared to the case where the ribbon is configured as an individual line.

Moreover, opposite ends of the integrated ribbon 380 may have a coupling hole and coupling structure pattern so as to correspond to each of the terminals 70 or to the second connection terminal 35, in order to increase the stability of coupling between the terminal 70 and the first connection terminal 35.

It is to be noted that the shape of the integrated ribbon 380 and the coupling structure between the integrated ribbon 389, the terminal 70 and the second connection terminal 35, and the like are not limited to the description or to that illustrated in the drawing, but may be easily altered by those skilled in the art.

What is claimed is:

1. A solar cell module comprising:
   a solar cell panel including a solar cell;
   at least two terminals extending from the solar cell;
   a bypass diode connecting the at least two terminals;
   a circuit unit including an inverter configured to convert a direct current output from the terminals into an alternating current;
   a ribbon connecting the terminals and the circuit unit;
   a terminal housing attached to a rear surface of the solar cell panel and configured to accommodate the terminals;

an inverter housing spaced apart from the solar cell panel by a predetermined distance and configured to accommodate the circuit unit and the bypass diode, an open space being defined between the inverter housing and the solar cell panel, wherein the inverter housing does not overlap with the terminal housing, a support portion on the rear surface of the solar cell panel, wherein the inverter housing is disposed on the support portion; and a plate attached to the rear surface of the solar cell panel, wherein the support portion is attached to the plate.

2. The solar cell module of claim 1, wherein the ribbon projects outward from the inverter housing.

3. The solar cell module according to claim 2, wherein an exposed portion of the ribbon between the terminal housing and the inverter housing has a length equal to or greater than half a distance between the inverter housing and the rear surface of the solar cell panel.

4. The solar cell module according to claim 1, wherein the terminals are disposed outside a rear surface area of the solar cell panel that corresponds to the inverter housing.

5. The solar cell module according to claim 1, further comprising a sealing material in the terminal housing, wherein the terminals are coated with the sealing material.

6. The solar cell module according to claim 1, further comprising a first fastening portion attached to the plate, and a second fastening portion configured to attach the inverter housing to the first fastening portion.

7. The solar cell module according to claim 1, wherein the circuit unit further includes a connection terminal connected to the ribbon, and wherein the connection terminal, the inverter, and the bypass diode are formed on a circuit board and are connected to one another by a circuit pattern.

8. The solar cell module according to claim 1, wherein the inverter housing includes an opening formed in a side surface of the inverter housing and the ribbon passes through the opening of the inverter housing.

9. The solar cell module according to claim 8, wherein the opening of the inverter housing is defined by a protrusion that protrudes from the side surface of the inverter housing.

10. The solar cell module according to claim 8, wherein the terminal housing has an opening formed in a side surface of the terminal housing and the ribbon passes through the opening of the terminal housing.

11. The solar cell module according to claim 10, wherein the opening of the terminal housing is defined by a protrusion that protrudes from the side surface of the terminal housing.

12. The solar cell module according to claim 1, further comprising a frame coupled to the inverter housing in a manner that the inverter housing is spaced apart from the rear surface of the solar cell panel by a distance that is equal to or less than a height of the frame.

13. The solar cell module according to claim 1, further comprising a protective layer that covers a portion of the ribbon, excluding opposite ends of the ribbon.

14. The solar cell module according to claim 1, wherein the ribbon has a length longer than a shortest path length from the terminals to the circuit unit.

15. The solar cell module according to claim 1, wherein the ribbon is detachably coupled to the terminals and to the circuit unit.

16. The solar cell module according to claim 1, further comprising a sealing material disposed between the circuit unit and the inverter housing.

17. A solar cell module comprising:
a solar cell panel including a solar cell;
a terminal housing configured to accommodate therein a terminal extending from a rear surface of the solar cell panel, the terminal housing being attached to the rear surface of the solar cell panel;
an inverter housing spaced apart from the rear surface of the solar cell panel, the inverter housing comprising a circuit unit including a bypass diode and an inverter that converts a direct current output from the terminal into an alternating current, an open space being defined between the inverter housing and the solar cell panel, wherein the inverter housing does not overlap with the terminal housing;
a ribbon connected to the terminal housing and the inverter housing and configured to transmit the direct current output from the terminal to the circuit unit,
a support portion on the rear surface of the solar cell panel, wherein the inverter housing is disposed on the support portion; and
a plate attached to the rear surface of the solar cell panel, wherein the support portion is attached to the plate.

18. The solar cell module according to claim 17, further comprising:
a frame, wherein the solar cell panel and the inverter housing are coupled to the frame.

19. The solar cell module according to claim 17, wherein the inverter housing includes a ribbon-accommodating portion in a side surface of the inverter housing and the ribbon passes through the ribbon-accommodating portion.

* * * * *